(12) United States Patent
Wulff et al.

(10) Patent No.: US 12,355,452 B2
(45) Date of Patent: Jul. 8, 2025

(54) FAST-LOCKING ALL-DIGITAL PHASE-LOCKED LOOP AND APPLICATIONS THEREOF

(71) Applicant: NORDIC SEMICONDUCTOR ASA, Trondheim (NO)

(72) Inventors: Carsten Wulff, Trondheim (NO); Tor Øyvind Vedal, Trondheim (NO); Ola Bruset, Trondheim (NO); Shankkar Balasubramanian, Trondheim (NO); Ruben Undheim, Trondheim (NO); Harald Garvik, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 45 days.

(21) Appl. No.: 18/569,459

(22) PCT Filed: Jun. 13, 2022

(86) PCT No.: PCT/EP2022/065967
§ 371 (c)(1),
(2) Date: Dec. 12, 2023

(87) PCT Pub. No.: WO2022/263348
PCT Pub. Date: Dec. 22, 2022

(65) Prior Publication Data
US 2024/0283459 A1  Aug. 22, 2024

(30) Foreign Application Priority Data
Jun. 14, 2021  (FI) .................................... 20215694

(51) Int. Cl.
*H03L 7/10* (2006.01)
*H03L 7/093* (2006.01)
*H03L 7/099* (2006.01)

(52) U.S. Cl.
CPC .............. *H03L 7/104* (2013.01); *H03L 7/093* (2013.01); *H03L 7/099* (2013.01); *H03L 2207/50* (2013.01)

(58) Field of Classification Search
CPC ..... H03L 7/104; H03L 2207/50; H03L 7/093; H03L 7/099; H03L 7/0991
See application file for complete search history.

(56) References Cited

U.S. PATENT DOCUMENTS

| | | |
|---|---|---|
| 2003/0141936 A1 | 7/2003 | Staszewski et al. |
| 2011/0081863 A1* | 4/2011 | Mendel .................. H03L 7/104 455/188.1 |

(Continued)

FOREIGN PATENT DOCUMENTS

| | | |
|---|---|---|
| EP | 2988421 A1 | 2/2016 |
| WO | 2015047280 A1 | 4/2015 |
| WO | 2019040199 A1 | 2/2019 |

OTHER PUBLICATIONS

International Search Report for PCT/EP2022/065967, mailed Dec. 5, 2022, 7 pages.

(Continued)

*Primary Examiner* — Khanh C Tran
(74) *Attorney, Agent, or Firm* — Nixon & Vanderhye PC

(57) ABSTRACT

According to an aspect, there is provided an all-digital phase-locked loop, ADPLL, for a radio receiver, transmitter or transceiver. The ADPLL comprises a time-to-digital converter for generating a digital time signal based on an external reference clock signal and a feedback signal, a switched capacitor digitally controlled oscillator, SC-DCO, for generating a radio frequency signal used as the feed-back signal, a phase-locked loop for controlling the SC-DCO based on the digital time signal for achieving a phase and frequency lock and digital processing means. The digital processing means are configured to maintain, in at least one (Continued)

memory, a lookup table defining a plurality of switching configurations of the SC-DCO corresponding to a plurality of frequencies of the radio frequency signal and to cause the phase-locked loop controller to adjust the switching configuration of the SC-DCO according to the lookup table.

17 Claims, 6 Drawing Sheets

(56) References Cited

U.S. PATENT DOCUMENTS

| | | |
|---|---|---|
| 2016/0238998 A1 | 8/2016 | Pavlovic et al. |
| 2017/0093411 A1 | 3/2017 | Tsai et al. |
| 2017/0126237 A1 | 5/2017 | Pavao Moreira et al. |
| 2017/0194973 A1* | 7/2017 | Moehlmann ............ H03L 7/093 |
| 2017/0366192 A1* | 12/2017 | Möehlmann ............ H03L 7/095 |
| 2019/0068199 A1 | 2/2019 | Li et al. |
| 2022/0187423 A1* | 6/2022 | Moehlmann ..... G01R 31/31703 |

OTHER PUBLICATIONS

Written Opinion of the ISA for PCT/EP2022/065967, mailed Dec. 5, 2022, 9 pages.
Search Report for FI 20215694, mailed Jan. 24, 2022, 2 pages.

* cited by examiner

FAST-LOCKING ALL-DIGITAL PHASE-LOCKED LOOP AND APPLICATIONS THEREOF

This application is the U.S. national phase of International Application No. PCT/EP2022/065967 filed Jun. 13, 2022, which designated the U.S. and claims priority to FI patent application No. 20215694 filed Jun. 14, 2021, the entire contents of each of which are hereby incorporated by reference.

TECHNICAL FIELD

Various example embodiments relate to phase-locked loops and devices employing phase-locked loops.

BACKGROUND

Phase-locked loops (PLLs) are control systems that generate an output signal whose phase is related to the phase of an input signal of the PLL (and thus also the frequency of the output signal is locked to the frequency of the input signal). PLLs may be used for a variety of purposes such as different synchronization functionalities, clock generation, demodulation and frequency synthesis. Conventional PLLs rely on feedback for achieving the initial lock of the phase and frequency. Achieving said locking is not immediate, but takes a finite amount of time during which the PLL is not yet providing the desired output. Ideally, the lock time of the PLL should be as short as possible while still providing high stability.

BRIEF DESCRIPTION

According to an aspect, there is provided an all-digital phase-locked loop, ADPLL, for a radio receiver, radio transmitter or radio transceiver. The ADPLL comprises:
  a time-to-digital converter for generating a digital time signal based on an external reference clock signal and a feedback signal;
  a switched capacitor digitally controlled oscillator, SC-DCO, for generating a radio frequency signal being either a transmission signal of the radio transmitter or transceiver or a local oscillator signal of the radio receiver or transceiver, wherein the SC-DCO comprises a variable load comprising a set of one or more parallel switchable capacitor banks and the radio frequency signal is used as the feedback signal;
  a phase-locked loop controller operatively connected between the time-to-digital converter and the SC-DCO for controlling the SC-DCO based on the digital time signal received from the time-to-digital converter for achieving a phase and frequency lock; and
  digital processing means communicatively connected to the phase-locked loop controller for:
    maintaining, in at least one memory, a lookup table defining a plurality of switching configurations of the SC-DCO corresponding to a plurality of frequencies of the radio frequency signal; and
    causing the phase-locked loop controller to adjust a switching configuration of the SC-DCO for generating a radio frequency signal having a frequency of the plurality of frequencies according to the lookup table for expediting locking of the all-digital phase-locked loop.

Said aspect provides the technical effect that locking of the all-digital phase-locked loop is performed in a very fast manner as the initial switching configuration maintained in the lookup table is already very close (or even identical) to the switching configuration corresponding to a locked state.

Said aspect provides the advantage that locking of the all-digital phase-locked loop is considerably expedited compared to the case where no lookup table is used for adjusting the switching configuration of the SC-DCO. Moreover, even if the all-digital phase-locked loop is cut off (e.g., no external reference clock is available), radio frequency signals may still be generated by the SC-DCO based on a plurality of switching configurations for a plurality of frequencies maintained in the lookup table. Moreover, no spurious transmissions are created when changing frequency used by the all-digital phase-locked loop so that in some transmitter applications it may be acceptable that the power amplifier stays on during the frequency switch.

Embodiments are defined in the dependent claims. The scope of protection sought for various embodiments is set out by the independent claims.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

The following embodiments are only presented as examples. Although the specification may refer to "an", "one", or "some" embodiment(s) and/or example(s) in several locations of the text, this does not necessarily mean that each reference is made to the same embodiment(s) or example(s), or that a particular feature only applies to a single embodiment and/or example. Single features of different embodiments and/or examples may also be combined to provide other embodiments and/or examples.

Phase-locked loops (PLLs) are control systems that generate an output signal whose phase is related to the phase of an input signal of the PLL (and thus also the frequency of the output signal is locked to the frequency of the in-put signal). Conventional PLLs comprise, in series, a phase (and/or frequency) comparator for comparing phases of an external input signal to a feedback signal, a loop filter and a voltage controlled oscillator (VCO) providing said feedback signal as an output. In other words, the output of the voltage controlled oscillator is fed back to the phase comparator. In some applications, a frequency divider is provided in the feedback loop, that is, the output signal is frequency-divided before it is fed back to the phase comparator. Thus enables generation of an output signal frequency of which is an integer multiple of the frequency of the input signal.

All-digital phase-locked loop (ADPLL) is one common type of PLL which is of particular interest in view of the embodiments. ADPLLs are phase locked loops where all of the phase detector, loop filter and the oscillator are digital elements. The oscillator in ADPLLs is called specifically a digitally controlled oscillator (DCO) as it is controlled via digital signals. Implementing a phase locked loop provides multiple benefits such as ease of manufacture and design and improved scalability. ADPLLs are commonly used, for example, in system on a chip (SoC) applications due to their smaller size and supply voltage limitations compared to traditional analog or partially analog PLLs.

As mentioned above, the PLLs have the fundamental property that the phase and frequency of the output signal of the PLL (i.e., the output of the voltage/digitally controlled oscillator) are locked to the phase and frequency of the input signal. Locking to a given input signal is, however, not immediate, but takes a certain finite amount time. The lock time of a PLL is a key parameter of a PLL defined as the time that elapses from initial or reset condition till the phase lock is reached (i.e., a phase locked output signal is generated by the oscillator). The lock time is typically predominantly influenced by the phase comparator and the loop filter as well as the gain of the oscillator. Ideally, the lock time of the PLL should be as short as possible while still providing high stability.

Figure 1:
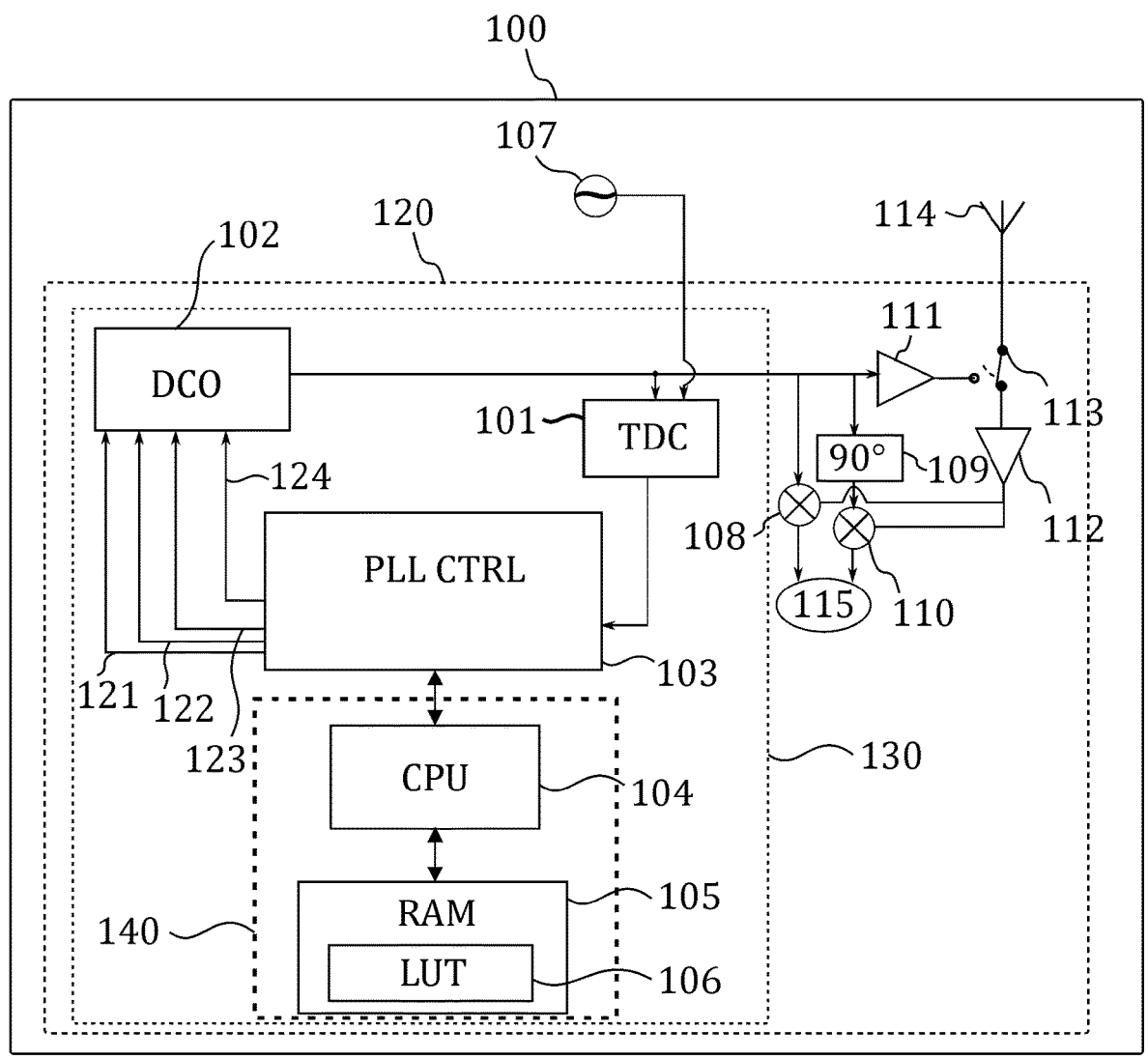
FIG. 1 illustrates a phase-locked loop according to embodiments may be employed.

FIG. 1 illustrates a radio transceiver 100 using an all-digital phase locked loop 130 according to embodiments. The radio transceiver 100 may be comprised, for example, in a user device (or a terminal device) or a system on a chip (or specifically in a radio peripheral thereof). It should be noted that FIG. 1 shows a somewhat simplified view of a radio transceiver with some of the elements of the radio transceiver 100 such as any possible impedance matching circuitry, any radio frequency filters and details of baseband processing circuitry not shown.

Referring to FIG. 1, the radio transceiver 100 comprises at least an all-digital phase-locked loop 130, radio frequency transmitter and reception circuitry 108 to 113 electrically connected to the all-digital phase-locked loop 130 and at least one antenna 114 for reception and transmission of radio signals.

The radio transceiver 100 may be electrically connected to an external reference signal source 107 for generating a radio frequency reference (clock) signal for the all-digital phase-locked loop 130. The external reference signal source 107 may be a reference oscillator such as a crystal oscillator. In other embodiments, the reference signal source 107 may form a part of the radio transceiver.

In regard to elements 108 to 114, the radio transceiver 100 may correspond to a conventional radio transceiver. Namely, the radio transceiver 100 comprises, similar to any conventional radio frequency (RF) transceiver, at least one antenna 114 followed by at least one low-noise amplifier (LNA) 112 in reception and preceded by at least one power amplifier (PA) 111 in transmission. To switch between reception and transmission, a switch 113 is provided. These elements are used for receiving and amplifying an RF signal received by the radio transceiver 100 and for amplifying and transmitting an RF signal generated by the all-digital phase locked loop 130 (specifically, by the switched capacitor digitally controlled oscillator 102 thereof). The at least one antenna 114 used for receiving or capturing the RF signal propagating in free space (e.g., in air) may be of any known antenna type. Similarly, the low-noise amplifier 112 may be any conventional low-noise amplifier and the power amplifier 111 may be any conventional power amplifier. Said at least one antenna element 114, said low-noise amplifier 112 and said power amplifier 111 may be specifically configured to operate at the plurality of operating frequencies (or frequency bands) of the radio transceiver 100.

In some embodiments, the PA 111 and/or the LNA 112 may be omitted.

In reception, first and second RF mixers 108, 110 are used for mixing the received amplified RF signal, respectively, with in-phase (0°) and quadrature (90°) local oscillator signals generated here specifically by the all-digital phase-locked loop 130 and, in the latter case, also by a 90° phase shifting element 109. These mixing operations result in I and Q baseband signals. In other words, elements 108 to 110 form an IQ demodulator. The I and Q digital signals may be subsequently processed by baseband processing (BBC) means 115 (or baseband processing circuitry). Said baseband processing means 115 may comprise means, for example, for analog baseband filtering, analog-to-digital conversion, demodulation (e.g., amplitude, phase and/or frequency demodulation) and/or storing the I and Q digital signals to a memory.

The all-digital phase-locked loop 130 comprises a time-to-digital converter (TDC) 101, a phase-locked loop controller (PLL CTRL) 103 and a switched capacitor digitally controlled oscillator (SC-DCO) 102 connected to each other for forming a feedback loop. The phase-locked loop controller (PLL CTRL) 103 is further connected to digital processing means 140 which may comprise at least one processor 104 and at least one memory 105 accessible by said at least one processor 104. Said digital processing means 140 (or at least said at least one processor 104) may also be communicatively connected to baseband processing means 115 of the radio transceiver for, e.g., enabling tuning of the frequency of the radio frequency signal generated by the SC-DCO 102 in reception.

Time-to-digital converters as used in all-digital phase-locked loops such as the time-to-digital converter 101 are digital analogues of phase/frequency detectors as used in conventional analog phase-locked loops. Here, the time-to-digital converter 101 is configured to generate a digital time signal based on an external reference clock signal received from the external reference signal source 107 and a radio frequency (feedback) signal received from the switched capacitor digitally controlled oscillator 102 (i.e., generated by the all-digital phase-locked loop 130 itself). Specifically, the generated digital time signal serves to quantify, in a digital format, the phase difference (or equally difference in instantaneous frequency) between the reference clock signal and the radio frequency feedback signal, that is, the difference in the number of clock cycles counted for said two signals. This information may be used in the all-digital phase-locked loop 130 for avoiding clock drift. The output of the time-to-digital converter 101 is connected to an input of the PLL controller 103.

The switched capacitor digitally controlled oscillator (SC-DCO) 102 is configured to generate a radio frequency signal based on one or more digital inputs 121 to 124 provided by the PLL controller 103. Said radio frequency signal may serve as the feedback signal provided for the TDC 101 as well as corresponding to either a transmission signal (in transmission) or a local oscillator signal (in reception). The SC-DCO 102 comprises a variable load which comprises at least as a set of one or more parallel (digitally) switchable capacitor banks. Specifically, the variable load may comprise the set of one or more parallel (digitally) switchable capacitor banks connected in parallel with at least one inductor (forming, thus, effectively a set of switchable LC resonance circuits). Each digitally switchable capacitor bank of the SC-DCO in the set may be configured to enable frequency tuning with a different level of coarseness (e.g., coarse tuning, medium coarse tuning and fine tuning). Each of digital inputs 121 to 123 may be associated with a particular switchable capacitor bank (i.e., a particular digital input serves to control switching of a particular switchable capacitor bank). Additionally, a digital input 124 for enabling/disabling the SC-DCO may be provided. The SC-DCO 102 is discussed in more detail in connection with an exemplary SC-DCO of FIG. 2.

The PLL controller 103 is operatively connected between the TDC 101 and the SC-DCO 102 for controlling the SC-DCO based on the digital time signal received from the time-to-digital converter for achieving a phase and frequency lock.

The PLL controller 103 may comprise at least a digital loop filter for generating the one or more digital inputs 121 to 124 for the SC-DCO 102 and a register interface for enabling communication with said at least one processor 104 (and thus also enabling access to said at least one memory 105). The PLL controller 103 may be implemented as a separate field-programmable gate array (FPGA) or a separate application-specific integrated circuit (ASIC). The phase-locked loop controller 103 according to one embodiment is discussed in more detail in connection with FIG. 3.

The PLL controller 103 may be controllable by the digital processing means 140 (i.e., by said at least one processor 104 and said at least one memory 105). For example, the digital processing means 140 may enable, via the PLL controller 103, tuning of the frequency of the output signal of the all-digital phase-locked loop 130, control enabling/disabling of the SC-DCO 102 and/or control whether the all-digital phase-locked loop 130 operates in a closed-loop operating mode or in an open-loop operating mode (equally called a free-running operating mode).

The digital processing means 140 may be configured at least for maintaining, in a memory (e.g., in a random access memory 105), a lookup table 106 defining a plurality of switching configurations of the SC-DCO 102 corresponding to a plurality of frequencies (of the radio frequency signal generated by the SC-DCO 102) and for causing the PLL controller to adjust a switching configuration of the SC-DCO 102 for generating at least one radio frequency signal having at least one frequency of the plurality of frequencies according to the lookup table 106. The causing of the phase-locked loop controller to adjust the switching configuration of the SC-DCO may be performed, e.g., in response to a switching of frequency desired to be generated by the SC-DCO. A switching configuration may correspond here to a certain set of positions of switches of the switchable capacitor banks of the SC-DCO 102 (i.e., bank control values of the switchable capacitor banks of the SC-DCO 102). Said adjusting may be followed by conventional locking operation of the all-digital phase-locked loop (closed-loop operation) or not (open-loop operation), as will be discussed in the following in more detail. Said digital processing means 140 may comprise at least said at least one processor 104 and said at least one memory 105 as shown in FIG. 1.

Specifically, said at least one memory 105 may comprise computer program code (i.e., software) so that the at least one memory 105 and computer program code are configured to, with the at least one processor 104, cause the digital processing means 140 to perform PLL control functionalities according to embodiments in communication with the PLL controller 103 (i.e., at least the functionalities of the previous paragraph). In general, said PLL control functionalities may comprise, e.g., generating the lookup table, maintaining the lookup table 106 in the memory, updating the lookup table, dynamically adjusting the switching configuration of the SC-DCO 102 both in open- and closed-loop operating modes and/or switching between the open- and closed-loop operating modes and/or between enabling/disabling of the SC-DCO 102, as will be described in more detail in the following.

Said at least one memory 105 may comprise one or more memories of any of the following types: a read-only memory (ROM), random-access memory (RAM), magnetoresistive random-access memory (MRAM), electrically erasable programmable ROM (EEPROM) and/or flash memory.

The digital processing means 140 may further comprise interfaces comprising hardware and/or software for realizing connectivity according to one or more communication protocols. The interfaces may comprise, for example, interfaces enabling the connections between the digital processing means 140 and other units or elements of the radio transceiver 100. The interfaces may provide communication connectivity at least to the PLL controller 103 (via its register interface). In some embodiments, the interfaces may provide the apparatus with communication capabilities to communicate in the cellular communication system and enable communication with network nodes (e.g., access nodes), terminal devices and one or more core network nodes, for example. The interfaces may comprise standard well-known components such as an amplifier, filter, frequency-converter, (de)modulator, and encoder/decoder circuitries and one or more antennas. The interfaces may comprise at least one user interface and/or an interface to a unit or element of the radio transceiver 100 providing a user interface and/or an interface to a unit or element of an apparatus (e.g., a SoC or a terminal device) comprising said radio transceiver and providing a user interface.

It should be emphasized that FIG. 1 corresponds to one simplified example of a radio transceiver to which all-digital phase-locked loop according to embodiments may be applied. In practical implementations of a radio transceiver used in connection with embodiments, one or more further analog and/or digital elements (e.g., any baseband circuitry, one or more antenna matching circuits, one or more RF filters, one or more amplifiers and/or one or more harmonic rejection downconversion mixers) may be provided.

While FIG. 1 illustrates a transceiver, the all-digital phase locked loop 130 may, according to other embodiments, be implemented in a radio receiver or a radio transmitter. Such embodiments may correspond to FIG. 1 with the switch 113 replaced with an electrical connection for enabling only receiver or transmitter operation. Further, in the case of a radio transmitter, the elements 108 to 110, 112 may be omitted while, in the case of a radio receiver, the power amplifier 111 may be omitted.

It should be noted that while FIG. 1 shows a topology where the SC-DCO 102 and the TDC 101 as well as the reference signal source 107 and the TDC 101 are connected to each other directly, in other embodiments, one or more circuit elements may be arranged between the SC-DCO 102 and the TDC 101 and/or between the reference signal source 107 and the TDC 101. Said one or more circuit elements may comprise, for example, one or more dividers such as one or more fractional-N dividers, one or more digital-to-time converters (for delaying the reference signal) and/or one or more pulse-pickers.

Figure 2:
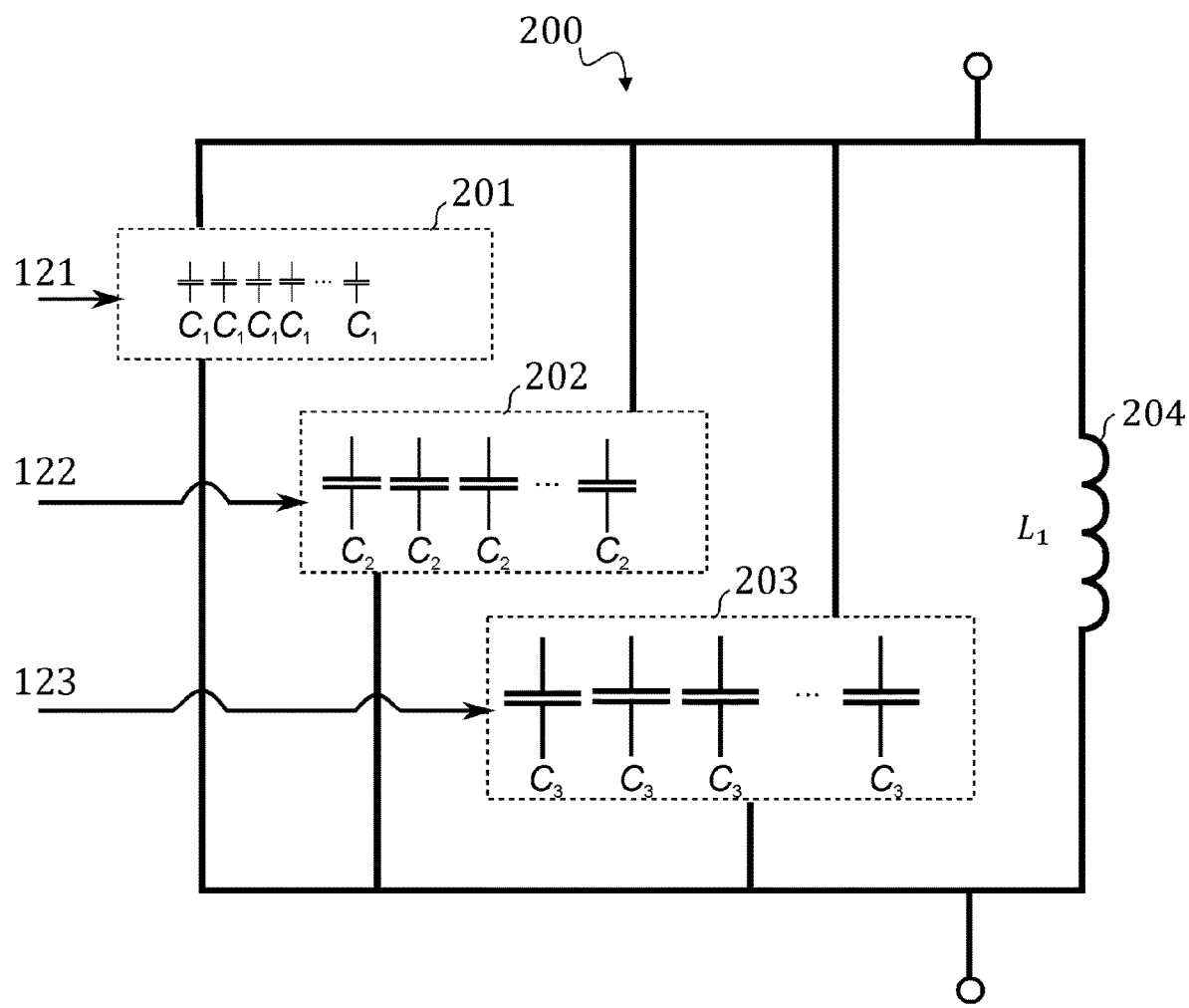
FIG. 2 illustrates an example of a digitally controlled oscillator based on capacitor banks for use in embodiments.

FIG. 2 shows a more detailed of view of an LC tank circuit (i.e., a variable load) of a switched capacitor digitally controlled oscillator which may be used in embodiments. The switched capacitor digitally controlled oscillator comprising said LC tank circuit may be, for example, the switched capacitor digitally controlled oscillator 102 of FIG. 1.

Referring to FIG. 2, the LC tank circuit 200 of the SC-DCO comprises a set of one or more parallel switchable capacitor banks 201, 202, 203. Specifically, in the illustrated example, the LC tank circuit 200 comprises at least a first switchable capacitor bank 203 for coarse tuning, a second switchable capacitor bank 202 for medium coarse tuning (i.e., less coarse tuning than the first switchable capacitor bank 203) and a switchable tracking capacitor bank 201 for frequency tracking (i.e., for accurate frequency control). For example, the switchable tracking capacitor bank 201 may correspond to sub-100 kHz tuning. The first switchable capacitor bank 203 is controllable by a coarse tuning digital control signal 121, a second switchable capacitor bank 202 is controllable by a medium coarse tuning digital control signal 122 and a switchable tracking capacitor bank 201 is controllable by a tracking digital control signal 123. The digital control signals 121, 122, 123 may be provided by the PLL controller 103, as illustrated in FIG. 1.

In other embodiments, the number of parallel switchable capacitor banks 201, 202, 203 may differ from the illustrated example. For example, one of the first and second switchable capacitor banks 202, 203 may be omitted in an embodiment.

Each of the switchable capacitor banks 201, 202, 203 is connected in parallel with an inductor 204 having a constant inductance value $L_1$, thus forming a set of switchable LC resonator circuits. As the inductance cannot be varied, it is the total capacitance value of the set of one or more parallel switchable capacitor banks 201, 202, 203 (variable by switching) which determines the frequency outputted by the switched capacitor digitally controller oscillator.

Each of the switchable capacitor banks 201, 202, 203 may specifically comprise a set of capacitors having the same capacitance value ($C_1$, $C_2$ and $C_3$, respectively, as shown in FIG. 1). The set of capacitors, in each of the switchable capacitor banks 201, 202, 203, may be connected in parallel, where each capacitor (or at least some of them) may be connected in series with a digitally controllable switch for enabling the tuning of total capacitance value associated with a given switchable capacitor bank 201, 202, 203. Here specifically, the inequality $C_1 < C_2 < C_3$ may hold for the capacitance values. In other embodiments, another number of switchable capacitor banks allowing different coarseness level for frequency tuning may be provided.

Figure 3:
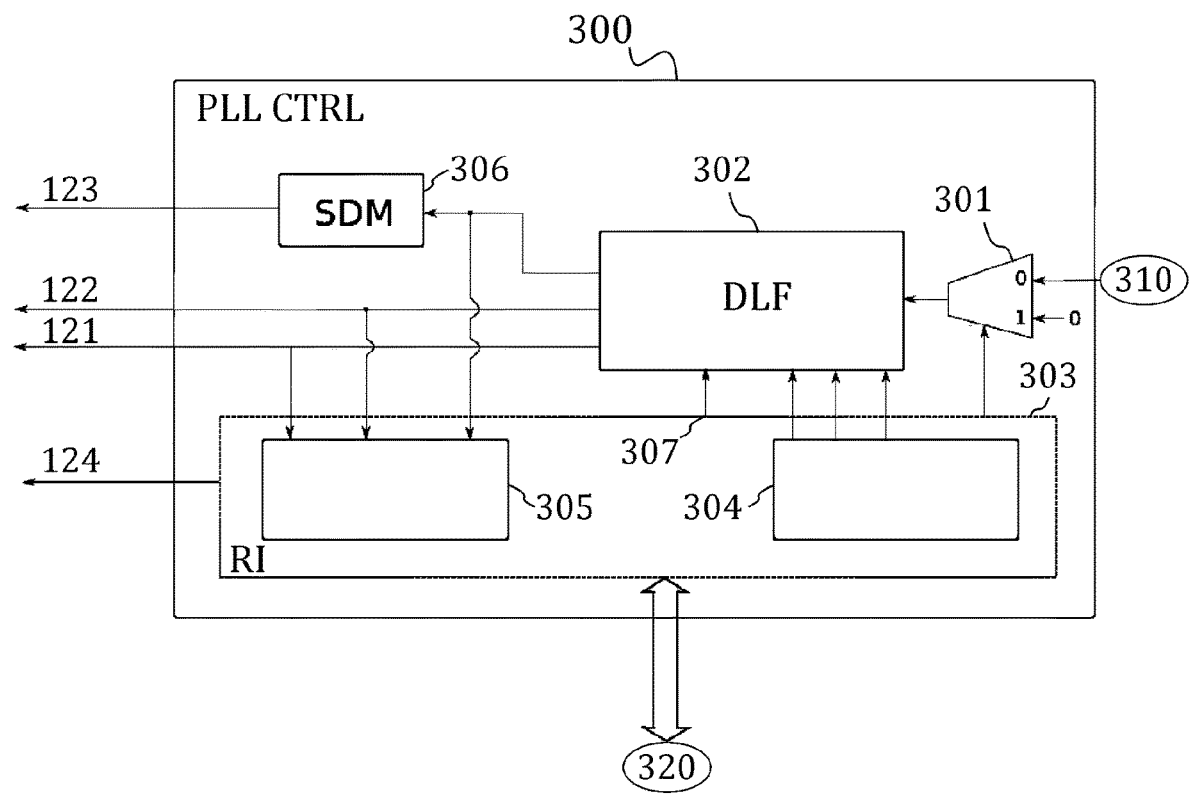
FIG. 3 illustrates an example of a phase-locked loop controller for use in embodiments.

FIG. 3 shows a more detailed of view of PLL controller 300 which may be used in embodiments. The PLL controller 300 may be, for example, the PLL controller 103 of FIG. 1.

Referring to FIG. 3, the PLL controller 300 comprises at least a digital loop filter 302 and a register interface (RI) 303 for enabling communication (via a control bus) between the digital loop filter 302 and the digital processing means 320 (or specifically at least one processor thereof). The digital loop filter 302 is configured to generate one or more parallel digital control signals 121, 122, 123 for adjusting the set of one or more parallel switchable capacitor banks of the SC-DCO, respectively. In other words, the one or more parallel digital control signals 121, 122, 123 correspond to a particular frequency outputted by the SC-DCO and to a switching configuration of a particular switchable capacitor bank for implementing said frequency in the SC-DCO, as defined in the lookup table. According to embodiments, said generation of the one or more parallel digital control signals may be based on a digital time signal received from the time-to-digital converter 310 in a closed-loop operating mode and/or on a lookup table maintained in a memory of said digital processing means 320. Said lookup table in the memory is accessible by said at least one processor which is, in turn, accessibly, by the digital loop filter 302, via the register interface 303.

Elements 304, 305 illustrate operations performed by the digital loop filter 302 via the register interface 303 (i.e., operations triggered by said at least one processor or operation targeting the at least one processor). Element 304 corresponds to an operation of loading a particular switching configuration (i.e., a set of capacitor bank values) maintained in (random access) memory accessible via the register interface 303 to the digital loop filter 302. Element 305 correspond to an inverse operation, that is, storing a particular switching configuration associated with a particular locked frequency to the (random access) memory via the register interface 303.

Element 307 corresponds to instructing the digital loop filter 302 on when to load values (i.e., to load a particular switching configuration) from the lookup table. Specifically, the instruction 307 may be used to ensure that the values are loaded at exactly the same clock cycle so as to make sure that the all-digital phase locked loop does not lose the lock.

The digital loop filter 302 may specifically output two digital control signals 121, 122 for direct feeding to the SC-DCO of the all-digital phase-locked loop. Said two digital control signals may be used for controlling two different switchable capacitor banks of the SC-DCO as discussed in connection with FIGS. 1 and 2 above. The two digital control signals 121, 122 may specifically correspond to digital control signals enabling coarse and medium coarse tuning of the frequency outputted by the SC-DCO. In general, one or more such digital control signals may be provided for controlling one or more respective switchable capacitor banks (associated with one or more different coarseness levels). Said one or more digital control signals 121, 122 may be defined based on the lookup table.

For enabling more precise control of the frequency of the SC-DCO, the PLL controller 300 comprises a sigma-delta modulator 306 connected to a tracking-related (i.e., precise tuning related) output of the digital loop filter 302. The sigma-delta modulator 306 is configured to perform sigma-delta modulation (equally called delta-sigma modulation) for the tracking digital control signal received from the digital loop filter 302 and thus to generate a more precise digital tracking signal for the SC-DCO. The sigma-delta modulation converts, in general, high bit-count, low-frequency digital signals into lower bit-count, higher-frequency digital signals. The density of the pulses in a sigma-delta modulated digital signal represents the average value of the digital signal over pre-defined period. The sigma-delta modulator 306 effectively enables much higher frequency resolution than the switchable tracking capacitor bank could reach alone. The sigma-delta modulator 306 outputs a tracking digital control signal 123 which may be fed to a switchable tracking capacitor bank of the SC-DCO, as discussed above. It should be noted that the lookup table may maintain, in this case, specifically information on a digital control signal to be inputted to the sigma-delta modulator 306 (not on the digital control signal 123 to be fed to the SC-DCO).

In some embodiments (e.g., where extremely precise frequency tuning is not required or where the switchable tracking capacitor bank provides high frequency resolution by itself), the sigma-delta modulator 306 may be omitted and the tracking digital control signal may be outputted directly by the digital loop filter 302.

In addition to the control of the digital loop filter 302, the register interface 303 also enables direct control of SC-DCO via the digital control signal 124 which may be used for enabling/disabling the SC-DCO.

In some embodiments such as the one illustrated in FIG. 3, the phase locked loop controller 300 further comprises a digital 2-to-1 multiplexer 301 for switching between open-loop and closed-loop operating modes. A first input pin (indicated with '0' in FIG. 1) of the digital 2-to-1 multiplexer 301 may be connected to an output of the time-to-digital converter 310, a second input pin (indicated with '1' in FIG. 1) of the digital 2-to-1 multiplexer 301 may be defined to have a constant bit value (here specifically 0). An output pin of the digital 2-to-1 multiplexer 301 may be connected to the digital loop filter 302. Finally, an input value of a selector pin of the digital 2-to-1 multiplexer 301 is controllable by said digital processing means 320 (or specifically by the at least one processor thereof) via the register interface 303. In other words, the output of the digital 2-to-1 multiplexer 301 by the digital processing means 320 via the register interface 303 and the selector pin. Depending on the value fed to the selector pin of the digital 2-to-1 multiplexer 301, different operating modes (i.e., open-loop or closed-loop operating modes) may be enabled.

In some embodiments, the digital 2-to-1 multiplexer 301 may be omitted (and replaced with an electrical connection between the time-to-digital converter and the digital loop filter 302 of the PLL controller 300). In such embodiments, the all-digital phase-locked loop may be configured to operate only using a closed-loop operating mode.

Figure 4:
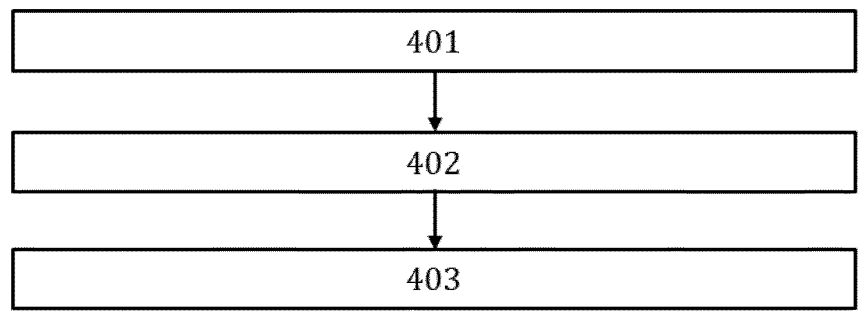
FIGS. 4 to 6 illustrate processes according to embodiments.
Figure 5:
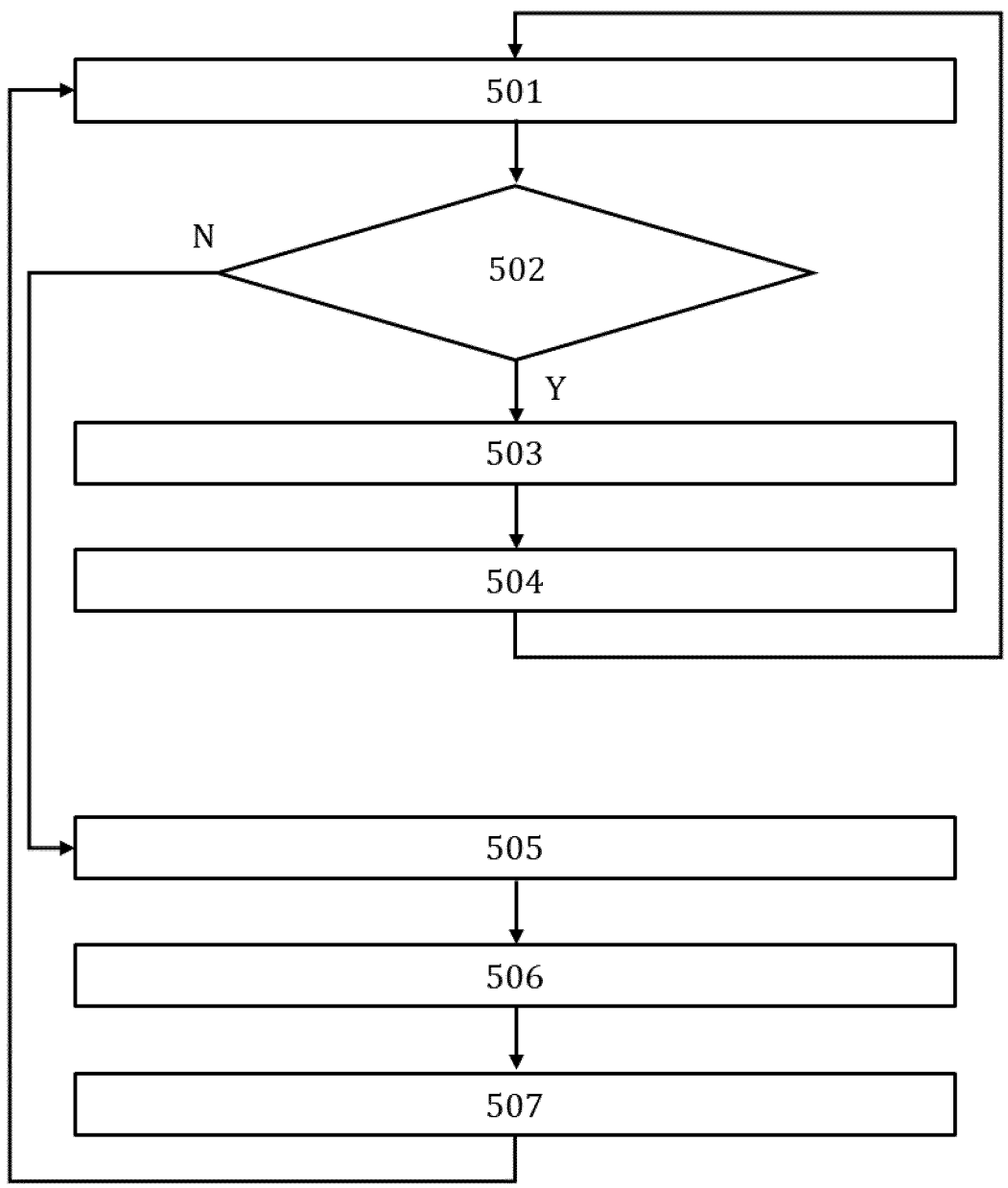

FIGS. 4 and 5 illustrate processes according to embodiments. Specifically FIG. 4 illustrates a process of adjusting the switching configuration of the SC-DCO in a closed-loop or open-loop operating mode and FIG. 5 illustrates generating and storing the lookup table. Said processes may be carried out by digital processing means of an all-digital phase-locked loop (such as the digital processing means 140 of FIG. 1) in communication with a PLL controller of the all-digital phase-locked loop. Specifically, the performance of the digital processing means may be caused by the at least one memory and computer program code comprised therein with the at least one processor in communication (via a register interface) with a PLL controller. Here, the at least one processor may correspond to the at least one processor 104 of FIG. 1, the at least one memory may correspond to the at least one memory 105 of FIG. 1 and the PLL controller may correspond to the PLL controller 103 of FIG. 1 and/or a PLL controller 300 of FIG. 3.

FIG. 4 may illustrate operation in a closed-loop operating mode where the all-digital phase-locked loop is "closed", that is, the all-digital phase-locked loop (or specifically the time-to-digital converter thereof) is assumed to be receiving a reference clock signal from an external reference signal source which is subsequently converted by the time-to-digital converter to a digital time signal and transmitted to the PLL controller. In some embodiments, the digital time signal may be received via a 2-to-1 multiplexer, as discussed in connection with FIG. 3.

Alternatively, FIG. 4 may illustrate operation in an open-loop operating mode where the all-digital phase-locked loop is "open", that is, the all-digital phase-locked loop (or specifically the time-to-digital converter thereof) may not be receiving a reference clock signal from an external reference signal source or at least no associated input is provided to the PLL controller. Such open-loop operation may be limited to a particular application and/or for short durations. In such embodiments, the illustrates process does not serve to merely expedite the locking of the all-digital phase-locked loop but to fully supersede or replace it.

Moreover, it is initially (regardless of operating mode) assumed that a lookup table defining a plurality of switching configurations of the SC-DCO corresponding (or mapped), respectively, to a plurality of frequencies of the radio frequency signal (generated by the SC-DCO) is maintained in a (random access) memory of the digital processing means in block 401, similar to above embodiments. How this lookup table may have been generated or collected is discussed below in connection with FIG. 5.

It is further assumed here that the all-digital phase-locked loop is currently scheduled to operate using a first frequency for which a switching configuration is defined in the lookup table. Said scheduling of the first frequency may be defined in a pre-defined frequency schedule maintained also in said at least one memory of the digital processing means in block 401. Said pre-defined frequency schedule may define at least a set of time instances with each time instance being mapped to a frequency of the plurality of frequencies defined in the lookup table. Said pre-defined frequency schedule may be called a pre-defined frequency scanning schedule when it is related frequency scanning (i.e., radio reception at certain scanning frequencies). Said pre-defined frequency schedule may also define time instances for activation and deactivation of the SC-DCO (e.g., activating the SC-DCO before adjusting the switching configuration and deactivating the SC-DCO after a pre-defined time has passed since activation).

Alternatively or additionally, said scheduling may have been defined by one or more user inputs provided by a user of an apparatus (e.g., a user of radio transmitter, receiver or transceiver or a user of a device comprising a radio transmitter, receiver or transceiver) comprising said all-digital phase-locked loop.

The digital processing means determine, in block 402, a switching configuration for the SC-DCO matching the (scheduled) first frequency defined in the pre-defined frequency schedule maintained in said at least one memory or by a user input (or other received input) based on the lookup table maintained in the at least one memory. As mentioned above, in this particular embodiment, it is assumed that such a switching configuration is currently defined in the lookup table.

The digital processing means cause, in block 403, the PLL controller to adjust the switching configuration of the SC-DCO of the all-digital phase-locked loop according to the determined switching configuration (i.e., to generate a radio frequency signal having the first frequency). Specifically, the at least one processor may command the PLL controller via the register interface to generate a set of one or more parallel digital control signals corresponding to the desired switching configuration for feeding to the SC-DCO (possibly via a sigma-delta modulator for the digital tracking signal as depicted in FIG. 3). In other words, the frequency and phase locking process of the all-digital phase-locked loop is sped up by configuring the SC-DCO to output a frequency assumed to correspond (or at least approximate) the locking frequency.

In some embodiments, the operation described in connection with blocks 402, 403 may be triggered in response to a switch of a frequency desired to be generated by the SC-DCO from a previous frequency to said first frequency. Said switch of frequency may be defined, e.g., in a pre-defined frequency schedule maintained in at least one memory or by a user input.

In closed-loop operating mode, after the initial adjustment in block 403, the switching configuration of SC-DCO may still need to be fine-tuned so as to lock the phase of the radio frequency signal generated by the SC-DCO to the phase of the external reference clock signal (and possibly to also adjust the frequency-lock). This fine-tuning may be carried out according to conventional phase-locked loop operating principles, that is, the digital loop filter may adjust its outputs (or at least some of them) based on the phase difference between the external clock reference signal and the feedback signal provided by the SC-DCO as quantified by the digital time signal outputted by the time-to-digital converter so as to minimize said phase difference. No further feedback from the digital processing means may be provided to the PLL controller after the initial switching configuration is defined, i.e., the locking occurs automatically from the point of view of the digital processing means.

However, when relocking by going from a first frequency channel to a second frequency channel (in the same frequency band or in a different frequency band compared to the first frequency channel), the phase which was locked for the first frequency channel may stay locked also after the change to the second frequency channel and thus the frequency change may be achieved (practically) instantly with zero or very short any settling time. When locking from a "cold" oscillator, the all-digital phase-locked loop will have to adjust the phase (i.e., to adjust the switching configuration) to achieve the (phase) lock. In any case, the frequency lock is reached much faster by taking advantage of the lookup table compared to a conventional frequency-locking using a phase-locked loop.

In the open-loop operating mode, no true locking of the all-digital phase-locked loop following the adjustment in block 403 is possible as the loop is cut off. Thus, in this case, the radio frequency signal outputted by the SC-DCO is determined fully by the lookup table. No fine-tuning of the switching configuration is possible as discussed for the closed-loop operating mode.

In some embodiments, the PLL controller may be configured to be able to switch between the closed-loop operating mode and the open-loop operating mode. The switching may be enabled, for example, by a 2-to-1 multiplexer connected to the time-to-digital converter and comprised in the PLL controller of the digital processing means, as discussed in connection with FIG. 3. Said switching may be controlled by the digital processing means (via the register interface of the PLL controller).

As mentioned above, FIG. 5 illustrates a process of generating the lookup table according to embodiments. It may be assumed here that initially the at least one memory of the digital processing means maintains no lookup table or an incomplete lookup table.

First, the digital processing means detect, in block 501, that operation of the all-digital phase-locked loop using a particular first frequency is scheduled. Said scheduling may be detected, for example, according to a pre-defined frequency schedule maintained in at least one memory of the digital processing means or be related to a received user input or other receiver input, similar to as discussed in connection with FIG. 4.

The digital processing means determine, in block 502, whether a switching configuration for the first frequency scheduled for generation by the all-digital phase-locked loop is comprised in the lookup table. This step may correspond to block 402 of FIG. 4 though, here, no assumptions are made regarding the outcome of the determination.

In response to no switching configuration for the first frequency being available in the lookup table in block 502, the digital processing means wait, in block 505, until the all-digital phase-locked loop locks to the first frequency (i.e., until certain lock time has passed), that is, until the output of the PLL controller settles to a particular set of one or more parallel digital control signals. During this waiting process, the output of the PLL controller may be communicated (periodically or continuously) to the digital processing means (via the register interface) as shown in FIG. 3. In other words, the frequency locking is carried out in a conventional (slow) manner in this case.

After the frequency lock has been reached, the digital processing means receive, in block 506, information on a current locked switching configuration for the first frequency from the PLL controller (via the register interface of the PLL controller) and store, in block 507, the first frequency and associated locked switching configuration of the SC-DCO to the lookup table. Thereafter, said full frequency locking procedure does not have to be repeated for that frequency, but the stored information may be used for substantially expediting the frequency locking in closed-loop operation or even performing the "frequency locking" without receiving any digital time signal by the PLL controller according to open-loop operation.

In response to a switching configuration being available in the lookup table in block 502, the digital processing means may perform, in blocks 503, 504, "fast locking" using the lookup table in a similar manner as discussed in connection with blocks 402, 403 of FIG. 4, respectively.

The process of FIG. 5 may be repeated for a plurality of different frequencies for generating or collecting a full lookup table covering all the frequencies of interest.

The process of FIG. 5 may be run when the all-digital phase-locked loop is first deployed and/or periodically or regularly after the initial deployment phase to ensure that the lookup table is up-to-date. Specifically, it may be necessary to update the values of the lookup table regularly as the optimal switching configuration of the SC-DCO for a given frequency may change over time due to changes in voltage and/or temperature conditions. Therefore, for optimal operation, the voltage and temperature conditions during the generation of the lookup table and during the use of said lookup table (i.e., loading values from the lookup table to the digital loop filter) should be similar.

In some embodiments, blocks 503, 504 may be omitted, that is, the process for generating the lookup table may always proceed through steps 501, 505, 506, 507 (i.e., the locking is always performed in a conventional manner and the results of the locking are always stored to the lookup table during a particular lookup table generation phase).

In some embodiments, the radio transceiver, transmitter or receiver may be configured to monitor the voltage and/or temperature conditions. Said monitoring may be performed using one or more sensors (e.g., temperature and/or voltage sensor) electrically connected to the digital processing means. Based on the monitoring, the digital processing means may trigger updating of the lookup table. Said updating may involve regenerating the lookup table according to the process of FIG. 5 starting again from an empty lookup table.

The all-digital phase-locked loop employing a lookup table stored to a memory according to embodiments may be used, for example, for performing a very fast and accurate frequency channel sweep for certain ranging algorithms and/or for monitoring a particular frequency band.

The all-digital phase-locked loop employing a lookup table stored to a memory according to embodiments has at least the following advantages:
- extremely fast frequency locking in a closed-loop operating mode is enabled,
- it is possible to use the all-digital phase-locked loop in an open-loop operating mode without any active (pure) external reference signal source (e.g., a crystal oscillator) and
- no spurious transmission is created when changing frequency so that in some transmitter applications it may be acceptable that the power amplifier stays on during the frequency switch.

Another possible application for the all-digital phase-locked loop according to embodiments is related to wake up receivers (WuRs). Wake up receivers are low-power radio receivers which are used as secondary or companion receivers for a primary radio receiver (e.g., a Bluetooth or WLAN receiver). The purpose of a wake up receiver is to detect when a signal is present and, upon such a detection, to wake up the primary radio receiver. The wake up receiver may be operating continuously (i.e., with high duty cycle) though it may be configured for detecting only a single (wake up) bit or other small amount of data causing it to have much lower power consumption than the primary radio receiver. The primary radio receiver is inactive unless woken up by the wake up receiver and is typically configured for receiving large amount of data (several Mb/s or even several Gb/s).

While introducing a separate wake up receiver in addition to the primary radio receiver may lead to reduction of overall power consumption, this benefit comes with several disadvantages such as increased chip area, longer design time needed, antenna loading and handover issues. To overcome said issues, it is suggested to use the all-digital phase locked loop according to embodiments in said primary radio receiver for enabling fast energy detection by said primary radio receiver itself. In other words, the need for the separate wake up receiver is eliminated by implementing the wake up functionalities in the primary radio receiver using the all-digital phase-locked loop capable of finding the local oscillator frequency very fast using the lookup table maintained in a (random access) memory.

Figure 6:
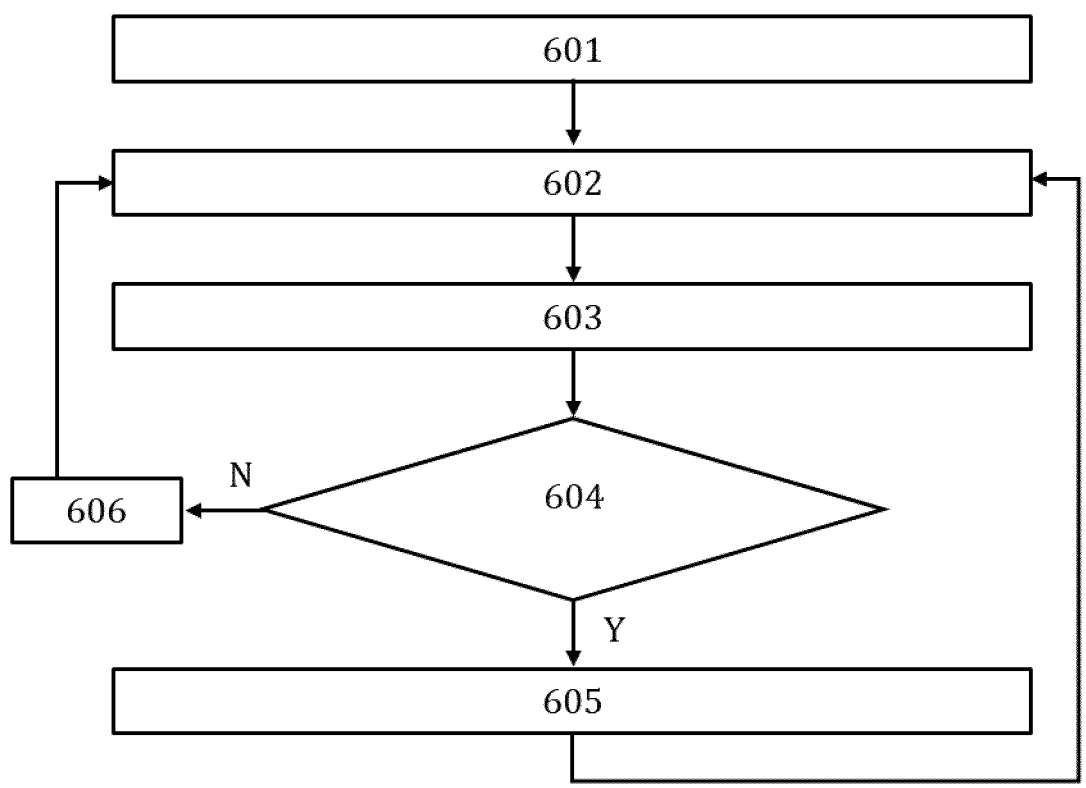

FIG. 6 illustrates a process according to embodiments for implementing wake up receiver type functionalities in a (primary) radio receiver or a radio transceiver. Specifically, said radio receiver or radio transceiver is assumed to comprise an all-digital phase-locked loop according to embodiments (e.g., the all-digital phase-locked loop 130 of FIG. 1). The process may be carried out, for example, by the radio transceiver of FIG. 1 or a corresponding radio receiver. In the following, the actor carrying out the process is called a radio receiver for simplicity.

Referring to FIG. 6, it is assumed, similar to above embodiments, that a lookup table defining a plurality of switching configurations of the SC-DCO corresponding to a plurality of frequencies of the radio frequency signal generated by the SC-DCO is maintained in at least one memory of the digital processing means of the all-digital phase-locked loop in block 601. It should be noted that, here, the radio frequency signal corresponds to a local oscillator signal of the radio receiver. Block 601 may correspond to block 401 of FIG. 4.

The radio receiver (or specifically the digital processing means of the all-digital phase-locked loop therein) turns on (or activates), in block 602, according to a pre-defined frequency schedule (here specifically a pre-defined frequency scanning schedule) maintained in said at least one memory of the digital processing means (and according to a real time clock). At least the SC-DCO may be turned on in block 602. Block 602 may also comprise adjusting the switching configuration of the SC-DCO of the all-digital phase-locked loop based on the lookup table and the pre-defined schedule (at least if the scheduled scanning frequency has changed since the last time the radio receiver was on). The all-digital phase-locked loop may be operated here specifically in an open-loop operating mode, that is, no external reference clock signal may be driving the all-digital phase-locked loop or at least no digital time signal produced by a time-to-digital converter is used for adjusting the switching configuration of the SC-DCO by the PLL controller. The switching configuration may correspond here to a first local oscillator frequency (i.e., being the frequency outputted by the SC-DCO) for enabling reception of signals having a first frequency.

In general, the radio receiver (or at least the SC-DCO therein) may be configured to periodically or regularly turn on, perform scanning at one or more frequencies (or specifically scanning of one or more advertisement frequency channels) and turn off after the scanning (i.e., turning off in response to the scanning finishing). This operation may be performed based on a real time clock and the pre-defined frequency scanning schedule. Between such active periods, the radio receiver may be "sleeping" (i.e., be in an inactive mode). Thus, the pre-defined frequency scanning schedule may define periodic or regular time instances when a particular local oscillator frequency of the local oscillator signal (i.e., of the radio frequency signal outputted by the SC-DCO) should be enabled for receiving signals of desired frequency, similar to as discussed in connection with FIG. 5. As, by taking advantage of the lookup table, there is no need to wait for a phase-locked loop to lock to a particular reference frequency, the scanning of frequencies may be carried out in a fast and energy-efficient manner (i.e., the amount of time that the radio receiver must be on for performing the scanning is minimized). Also, no separate reference clock signal source needs to be provided.

After the adjusting in block 602, the radio receiver receives, in block 603, a first signal having the first frequency via at least one antenna of the radio receiver, a low-noise amplifier and an IQ demodulation means (e.g., elements 108 to 110 of FIG. 1). In some embodiments, the low-noise amplifier may be omitted. The IQ demodulation means are specifically configured to IQ demodulate the amplified first signal using the radio frequency signal generated by the SC-DCO as the local oscillator signal so as to generate in-phase and quadrature baseband signals, as depicted, e.g., in FIG. 1. The radio frequency signal is generated, here, based on said pre-defined frequency scanning schedule.

Upon reception in block 603, the radio receiver determines, in block 604, whether the received I and Q baseband signals (or one of them) meet one or more pre-defined signal detection criteria. Said one or more pre-defined signal detection criteria may define, for example, one or more energy (i.e., amplitude) detection criteria, one or more phase detection criteria and/or frequency detection criteria. In some embodiments, the determination in block 604 may be based not only on the most recently or presently received I and/or Q baseband signals but also on one or more corresponding previously received I and/or Q baseband signals. For example, a detection may be triggered according to said one or more pre-defined signal detection criteria only if said one or more pre-defined signal detection criteria are satisfied for a plurality of successively received I and/or Q baseband signals.

In some embodiments, said one or more pre-defined signal detection criteria may comprise at least one or more energy detection criteria. Said one or more energy detection criteria may comprise a lower threshold or limit for an energy or power level of the received signal.

In some embodiments, said one or more pre-defined energy detection criteria may comprise specifically one or more on off keying (OOK) criteria for detecting power level steps according to the OOK principle (i.e., for detecting an OOK signal). On-off keying (OOK) denotes the simplest form of amplitude-shift keying (ASK) modulation where digital data is represented as the presence or absence of a carrier wave corresponding, respectively, to an on state and an offset state.

In some embodiments, the radio receiver may initially evaluate the received I and Q baseband signals (or one of them) against one or more first predefined signal detection criteria (e.g., lower threshold or limit for an energy or power level of the received signal and/or any other non-OOK specific criteria discussed above). Then, the radio receiver will look for an OOK signal based on one or more second pre-defined criteria relating specifically to OOK signal detection (i.e., the aforementioned one or more OOK criteria). The detection of an OOK signal may be specifically based on a plurality of consecutive received (I and/or Q) signals. Specifically, the one or more second pre-defined signal detection criteria may define a pre-defined wake up pattern for said plurality of consecutive received signals. The pre-defined wake up pattern is defined as a pattern of consecutive successful/failed signal detections, where success or failure of signal detection is evaluated according to said one or more first pre-defined signal detection criteria (i.e., one or more non-OOK specific criteria). The pre-defined wake up pattern is assumed to correspond to a matching pre-defined wake up signal which comprises a sequence of (time) signal segments each of which has either zero amplitude or nonzero amplitude (and thus the sequence defined a certain OOK pattern). Adjacent signal segments in the sequence may be separated in time by a pre-defined (nonzero) duration. To give a simplistic example, the pre-defined wake up pattern to be detected may have a form 101011 where '1' indicates a reception of a signal (an 'on' state in the on-off keying) and '0' indicates no reception of signal (an 'off' state in the on-off keying). In these embodiments, the full detection (and thus generation of a wake up signal) is triggered only if the one or more second pre-defined signal detection criteria are satisfied (i.e., an OOK signal is detected).

Said determining in block 604 may be performed by detection means such as a dedicated detector circuit comprised in the radio receiver. Said detection means may be operatively connected between one or both of the first and second RF mixers (i.e., mixers 108, 110 in FIG. 1) and the baseband processing means (i.e., element 115 of FIG. 1). Alternatively, the detection means may form a part of the baseband processing means or circuitry 115. This determination effectively decides whether the radio receiver should be "woken up" in full to properly receive the first signal or whether the first signal is a false positive (e.g., a very low power signal or just noise).

In response to the received I and/or Q baseband signals (optionally along with one or more preceding corresponding received signals) meeting the one or more pre-defined signal detection criteria (e.g., the received first signal exceeds said lower threshold or limit for energy or power level or an OOK pattern is detected) in block 604, the radio receiver proceeds, in block 605, to further (baseband) process the I and Q baseband signals. In other words, the as-of-yet sleeping parts of the radio receiver are "woken up" so that the first signal may be fully processed. In practice, the detection means may transmit, in block 605, a wakeup signal to baseband processing means of the radio receiver (e.g., the baseband processing means 115 of FIG. 1) in response to the positive determination in block 604. Upon receiving the wakeup signal, the baseband processing means may process, in block 605, the I and Q baseband signals. Said processing may comprise, for example, digital filtering and/or (amplitude and/or phase) demodulation and/or any other conventional reception baseband processing functionalities.

In some embodiments, the wakeup signal may correspond to one or both of the I and Q baseband signals, instead of being a dedicated signal such as a dedicated one-bit signal.

If the received first signal (or specifically the I and Q baseband signals derived therefrom) fails to meet the one or more pre-defined signal detection criteria (e.g., the received first signal fails to exceed said lower threshold or limit for energy or power level) in block 604, the radio receiver turns off, in block 606, until subsequent scheduled activation in block 602. The received first signal may be simply ignored.

In some embodiments, the output of the SC-DCO of the all-digital phase-locked loop may be operatively connected to a frequency divider (i.e., a clock divider) for generating a frequency-divided radio frequency signal. Said frequency-divided radio frequency signal may be used as the system clock (i.e., the real time clock) of the radio receiver used in the wakeup receiver mode. This functionality may be similar to the corresponding frequency-division functionality in the following embodiment discussed in connection with FIG. 7.

Figure 7:
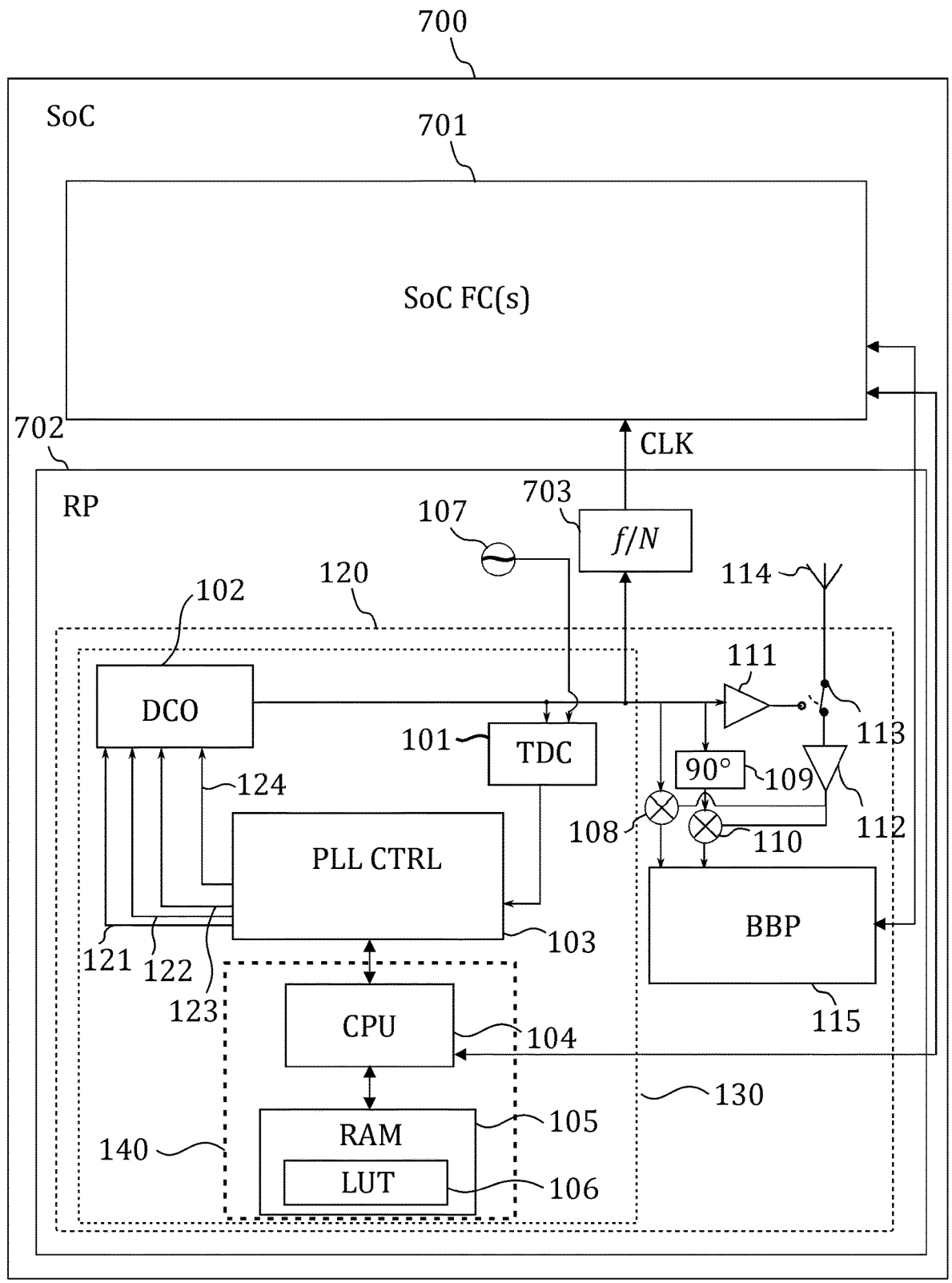
FIG. 7 illustrates a system on a chip with a radio peripheral according to embodiments.

Another possible application for the all-digital phase-locked loop according to embodiments is related to its use in a system on a chip (SoC) comprising a radio peripheral. FIG. 7 illustrates such a system on chip integrated circuit 700 with a radio peripheral 702 according to embodiments. FIG. 7 corresponds to a schematic diagram showing only elements of the SoC 700 which are of importance in view of the embodiments.

Referring to FIG. 7, the SoC 700 may be any known SoC comprising one or more functional circuits (or units or elements) 701 and a radio peripheral 702.

The one or more functional elements 701 may be any known hardware functional elements found in SoC integrated circuits. The one or more functional circuits 701 may comprise active and/or passive elements. Electrical power may be supplied for any active elements internally or externally. Specifically, the one or more functional circuits 701 may comprise, for example, one or more processor cores, one or more memories, one or more interfaces and/or one or more peripherals (other than the radio peripheral 702).

The one or more processor cores may comprise, e.g., one or more microcontrollers, one or more microprocessors, one or more digital signal processors (DSPs) and/or one or more application-specific instruction set processor (ASIP) cores. The processor cores may form one or more processors or central processing units (CPUs). In some embodiments, the one or more functional elements 106 may comprise a plurality of processors cores.

The one or more memories utilized by at least the one or more processors may comprise one or more memories of any of the following types: a read-only memory (ROM), random-access memory (RAM), magnetoresistive random-access memory (MRAM), electrically erasable programmable ROM (EEPROM) and/or flash memory.

The one or more interfaces may comprise one or more external interfaces at least some of which may be associated with particular communication protocols. The supported communication protocols may comprise, for example, any of universal serial bus (USB), FireWire, Ethernet, universal synchronous and asynchronous receiver-transmitter (USART), serial peripheral interface (SPI), high-definition multimedia interface (HDMI), inter-integrated circuit (I2C). Additionally or alternatively, one or more wireless communication protocols may be supported. The one or more wireless communication protocols may comprise, for example, Wi-Fi, Bluetooth, IPv6 over Low-Power Wireless Personal Area Networks (6LoWPAN) and/or near-field communication. Additionally or alternatively, the one or more interfaces may comprise one or more analog interfaces such as analog-to-digital and/or digital-to-analog converters, e.g., for signal processing. The analog interfaces may be able to interface with different types of sensors or actuators.

The one or more functional elements 701 may be communicatively connected via one or more interfaces to the radio peripheral 702. For example, the one or more functional elements 701 may be communicatively connected to the at least one processor 104 of the all-digital phase-locked loop 130 and/or to the baseband processing means 115, as depicted in FIG. 7. Thus, the one or more functional elements 701 of the SoC 700 may enable controlling the functions of the radio peripheral 702 (e.g., operation of the all-digital phase-locked loop according to embodiments).

The radio peripheral or unit 702 may comprise a radio receiver, transmitter or transceiver according to any of the previous embodiments or at least an all-digital phase-locked loop according to any of the previous embodiments. FIG. 7 illustrates specifically an exemplary case where the radio peripheral comprises the radio transceiver of FIG. 1. The radio peripheral 702 may be an internal and/or external peripheral of the SoC 700.

Typically, the oscillator 102 of a radio peripheral 702 operates at significantly higher frequencies compared to system clock frequencies of most power-optimized SoCs (e.g., the oscillator operating above 2 GHz while the system clock corresponding to frequencies below 400 MHZ) and thus, in order to use the as a system clock signal, frequency division needs to be performed. Correspondingly, the radio peripheral 702 further comprises a frequency divider 703 (i.e., a clock divider) operatively connected to an output of the SC-DCO 102 for generating a frequency-divided radio frequency signal. The SoC 700 (or the one or more functional circuits 701 thereof) may be specifically configured to use the frequency-divided radio frequency signal as a digital system clock of the SoC 700. Specifically, the all-digital phase-locked loop 130 may be configured at least for operation in an open-loop operating mode (as discussed above, e.g., in connection with FIG. 5). This enables fast and accurate generation of a digital system clock signal while avoiding powering on the reference signal source 107 (e.g., a crystal oscillator) and thereby saving power. It is assumed here, similar to the above embodiments, that the SC-DCO 102 in the radio peripheral 702 has at an earlier point in time been locked to the reference signal source 107 using the all-digital phase locked loop 130 and the lookup table 105 defining switching configuration of the SC-DCO for certain plurality of frequencies have been stored to at least one memory 105. Thus, when the radio peripheral 702 (or specifically the all-digital phase-locked loop 130) is turned on (again), the all-digital phase-locked loop 130 may be free-running (i.e., operating in the open-loop operating mode) and still provide the correct and accurate frequency (assuming similar temperature and voltage conditions are maintained). It may be beneficial to do this especially when the radio peripheral 702 needs, in any case, to be on such as when powering on the SoC 700 for a short time to monitor a particular radio frequency band.

While the reference signal source 107 is shown in FIG. 1 as being comprised in the radio peripheral 702, in other embodiments, the reference signal source 107 may be external to the radio peripheral 702 (and electrically connected or connectable to it). It should be noted that as the reference signal source 107 may be needed only for initial generation of the lookup table (as discussed, e.g., in connection with FIG. 6) if the all-digital phase-locked loop is operated in an open-loop operating mode, the reference signal source 107 does not have to be present during the operation of the SoC 700.

Sometimes a crystal oscillator for a radio peripheral of a SoC is too expensive to run, that is, the time for the frequency to settle is too long if a low noise level is desired (e.g., in the order of milliseconds) and thus the average power required is high (since the SoC needs to be on for a longer time to receive the same packet). In such a case the obvious alternative would be to use an RC oscillator or ring oscillator which, however, suffer from bad phase noise behavior. When the all-digital phase-locked loop according to embodiments is run in an open-loop operating mode (i.e., relying solely on the information in the lookup table) only an LC oscillator which has much lower phase noise compared to, e.g., RC or ring oscillator is active (followed by a frequency divider).

While FIG. 7 shows a radio peripheral 702 comprising a radio transceiver, in other embodiments, the radio peripheral may comprise only a radio transmitter or a radio receiver.

As used in this application, the term 'circuit' (or equally 'circuitry') refers to one or more of the following: hardware-only circuit implementations such as implementations in only analogue and/or digital circuitry; combinations of hardware circuits and software and/or firmware; and circuits such as a microprocessor(s) or a portion of a microprocessor(s) that require software or firmware for operation, even if the software or firmware is not physically present. This definition of 'circuit' applies to uses of this term in this application. The term "circuit" would also cover, for example and if applicable to the particular element, a baseband integrated circuit, an application-specific integrated circuit (ASIC), and/or a field-programmable grid array (FPGA) circuit for the apparatus according to an embodiment of the invention.

In an embodiment, at least some of the processes described in connection with FIGS. 4 to 6 may be carried out by an apparatus comprising corresponding means for carrying out at least some of the described processes. Some example means for carrying out the processes may include at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chipset (procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

At least some of the embodiments may also be carried out in the form of a computer process defined by a computer program or portions thereof. Embodiments of the methods described in connection with digital processing such as embodiments of FIGS. 4 and 5 may be carried out by executing at least one portion of a computer program comprising corresponding instructions. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

Embodiments described herein are applicable to systems defined above but also to other systems. The specifications of the systems and their elements develop rapidly. Such development may require extra changes to the described embodiments. Therefore, all words and expressions should be interpreted broadly and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. An all-digital phase-locked loop, ADPLL, for a radio receiver, radio transmitter or radio transceiver, the ADPLL comprising:
   a time-to-digital converter for generating a digital time signal based on an external reference clock signal and a feedback signal;
   a switched capacitor digitally controlled oscillator, SC-DCO, for generating a radio frequency signal being either a transmission signal of the radio transmitter or transceiver or a local oscillator signal of the radio receiver or transceiver, wherein the SC-DCO comprises a variable load comprising a set of one or more parallel switchable capacitor banks and the radio frequency signal is used as the feedback signal;
   a phase-locked loop controller operatively connected between the time-to-digital converter and the SC-DCO for controlling the SC-DCO based on the digital time signal received from the time-to-digital converter for achieving a phase and frequency lock; and
   digital processing means communicatively connected to the phase-locked loop controller for:
      maintaining, in at least one memory, a lookup table defining a plurality of switching configurations of the SC-DCO corresponding to a plurality of frequencies of the radio frequency signal; and
      causing the phase-locked loop controller to adjust a switching configuration of the SC-DCO for generating a radio frequency signal having a frequency of the plurality of frequencies according to the lookup table for expediting locking of the all-digital phase-locked loop.

2. The all-digital phase-locked loop of claim 1, wherein the causing of the phase-locked loop controller to adjust the switching configuration of the SC-DCO comprises:
   determining a switching configuration for the SC-DCO matching a frequency scheduled for generation by the all-digital phase-locked loop based on the lookup table, wherein the frequency is one of said plurality of frequencies and is defined in a pre-defined frequency schedule maintained in said at least one memory or by a user input communicated to the digital processing means; and
   causing the phase-locked loop controller to adjust a switching configuration of the SC-DCO according to the determined switching configuration so as to generate a radio frequency signal having said frequency for expediting frequency and phase locking of the all-digital phase-locked loop,
   wherein the phase-locked loop controller is configurable to operate, at a time, either in a closed-loop operating mode where the switching configuration of the SC-DCO is continuously controlled based on the digital time signal received from the time-to-digital converter for achieving a phase and frequency lock or in an open-loop operating mode where no digital time signal is receivable by the phase-locked loop controller from the time-to-digital converter, the digital processing means being further configured to cause the phase-locked loop controller to switch between the open-loop operating mode and the closed-loop operating mode.

3. The all-digital phase-locked loop according to claim 1, wherein the digital processing means are further configured to perform:
   causing the phase-locked loop controller to activate the SC-DCO before the adjusting of the switching configuration of the SC-DCO.

4. The all-digital phase-locked loop according to claim 1, wherein the causing of the phase-locked loop controller to adjust the switching configuration of the SC-DCO is performed in response to a switch of the frequency desired to be generated by the SC-DCO.

5. The all-digital phase-locked loop according to claim 1, wherein the digital processing means are further configured to generate the lookup table by performing the following for each of the plurality of frequencies:
   determining whether a switching configuration for a first frequency of the plurality of frequencies scheduled for generation by the all-digital phase-locked loop is comprised the lookup table, wherein the first frequency is defined in a pre-defined frequency schedule maintained in said at least one memory or by a user input communicated to the digital processing means; and in response to no switching configuration for the first frequency being available in the lookup table, waiting for the all-digital phase-locked loop to lock to the first frequency and, following the locking, receiving information on a current locked switching configuration for the first frequency from the PLL controller and storing the first frequency and the current locked switching configuration of the SC-DCO to the lookup table.

6. The all-digital phase-locked loop according to claim 1, wherein the digital processing means comprise:
at least one processor communicatively connected to the phase-locked loop controller for controlling the phase-locked loop controller; and
said at least one memory accessible by said at least one processor and comprising program instructions executable by the at least one processor for causing the performance of the digital processing means.

7. The all-digital phase-locked loop according to claim 1, wherein the phase-locked loop controller comprises:
a digital loop filter for generating one or more parallel digital control signals enabling the controlling of the SC-DCO; and
a register interface for communication between the digital loop filter and the digital processing means.

8. The all-digital phase-locked loop according to claim 7, wherein the register interface is further configured to enable transmitting of activation and deactivation signals from the digital processing means to the SC-DCO.

9. The all-digital phase-locked loop of claim 7, wherein the phase locked loop controller further comprises:
a digital 2-to-1 multiplexer for switching between open and closed loop operating modes, wherein a first input pin of the digital 2-to-1 multiplexer is connected to an output of the time-to-digital converter, a second input pin of the digital 2-to-1 multiplexer is defined to have a constant bit value, an output pin of the digital 2-to-1 multiplexer is connected to the digital loop filter and an input value of a selector pin of the digital 2-to-1 multiplexer is controllable by the digital processing means via the register interface.

10. The all-digital phase-locked loop according to claim 7, wherein the set of one or more parallel switchable capacitor banks of the SC-DCO comprises a switchable tracking capacitor bank for frequency tracking and the phase-locked loop controller further comprises:
a sigma-delta modulator for generating a tracking signal for inputting to the SC-DCO based on a digital signal received from the digital loop filter.

11. The all-digital phase-locked loop according to claim 1, wherein the set of one or more parallel switchable capacitor banks of the SC-DCO comprises at least a first switchable capacitor bank for coarse tuning, a second switchable capacitor bank for less coarse tuning than the first switchable capacitor bank and a switchable tracking capacitor bank for frequency tracking.

12. The all-digital phase-locked loop according to claim 1, wherein said variable load further comprises at least one inductor connected in parallel with the set of one or more parallel switchable capacitor banks.

13. A radio device, comprising an all-digital phase-locked loop, ADPLL, for generating the local oscillator signal of the radio device, the ADPLL comprising:

a time-to-digital converter for generating a digital time signal based on an external reference clock signal and a feedback signal;
a switched capacitor digitally controlled oscillator, SC-DCO, for generating a radio frequency signal being either a transmission signal of the radio transmitter or transceiver or a local oscillator signal of the radio receiver or transceiver, wherein the SC-DCO comprises a variable load comprising a set of one or more parallel switchable capacitor banks and the radio frequency signal is used as the feedback signal;
a phase-locked loop controller operatively connected between the time-to-digital converter and the SC-DCO for controlling the SC-DCO based on the digital time signal received from the time-to-digital converter for achieving a phase and frequency lock; and
digital processing means communicatively connected to the phase-locked loop controller for:
maintaining, in at least one memory, a lookup table defining a plurality of switching configurations of the SC-DCO corresponding to a plurality of frequencies of the radio frequency signal; and
causing the phase-locked loop controller to adjust a switching configuration of the SC-DCO for generating a radio frequency signal having a frequency of the plurality of frequencies according to the lookup table for expediting locking of the all-digital phase-locked loop.

14. A radio device according to claim 13, wherein the radio device is a radio transmitter, a radio receiver, or a radio transceiver.

15. A radio device according to claim 13, wherein the radio device is a radio receiver or a radio transceiver, and wherein the ADPLL is configured to for generate the local oscillator signal of the radio receiver or the radio transceiver, and wherein the digital processing means of the all-digital phase-locked loop are configured to activate the SC-DCO of the all-digital phase-locked loop, to adjust the switching configuration of the SC-DCO based on the lookup table according to a pre-defined frequency scanning schedule maintained in said at least one memory and to deactivate the SC-DCO following the adjusting and the radio receiver further comprises at least:
at least one antenna for receiving a first signal having a first frequency;
an in-phase quadrature, IQ, demodulation means for IQ demodulating the first signal using the radio frequency signal generated by the SC-DCO as the local oscillator signal so as to generate in-phase and quadrature baseband signals, wherein the radio frequency signal is generated based on said pre-defined frequency scanning schedule;
detection means for determining whether one or both of the in-phase and quadrature baseband signals presently received or a combination of said one or both of the in-phase and quadrature baseband signals presently received and one or more corresponding signals previously received meet one or more pre-defined signal detection criteria and for generating a wake up signal in response to said one or more pre-defined signal detection criteria being met; and
baseband processing means for processing the in-phase and quadrature baseband signals in response to receiving the wake up signal.

16. A radio device according to claim 13, wherein the radio device is a radio receiver or a radio transceiver, and wherein the ADPLL is configured to for generate the local oscillator signal of the radio receiver or the radio transceiver, and wherein said one or more pre-defined signal detection criteria comprise one or more first pre-defined signal detection criteria and one or more second pre-defined signal detection criteria and the detection means are further configured to perform:

determining whether said one or both of the in-phase and quadrature baseband signals presently received meet the one or more first pre-defined signal detection criteria; and determining whether said combination of said one or both of the in-phase and quadrature baseband signals and said one or more corresponding signals previously received meet one or more second pre-defined signal detection criteria, wherein the one or more second pre-defined signal detection criteria correspond to criteria for detecting an on-off keying signal based on signal detection using said one or more first pre-defined signal detection criteria.

17. A system on a chip, SoC, comprising a radio peripheral, wherein the radio peripheral comprises an all-digital phase-locked loop, ADPLL, for a radio receiver, radio transmitter or radio transceiver, the ADPLL comprising:

a time-to-digital converter for generating a digital time signal based on an external reference clock signal and a feedback signal;

a switched capacitor digitally controlled oscillator, SC-DCO, for generating a radio frequency signal being either a transmission signal of the radio transmitter or transceiver or a local oscillator signal of the radio receiver or transceiver, wherein the SC-DCO comprises a variable load comprising a set of one or more parallel switchable capacitor banks and the radio frequency signal is used as the feedback signal;

a phase-locked loop controller operatively connected between the time-to-digital converter and the SC-DCO for controlling the SC-DCO based on the digital time signal received from the time-to-digital converter for achieving a phase and frequency lock;

digital processing means communicatively connected to the phase-locked loop controller for:

maintaining, in at least one memory, a lookup table defining a plurality of switching configurations of the SC-DCO corresponding to a plurality of frequencies of the radio frequency signal; and causing the phase-locked loop controller to adjust a switching configuration of the SC-DCO for generating a radio frequency signal having a frequency of the plurality of frequencies according to the lookup table for expediting locking of the all-digital phase-locked loop; and a frequency divider operatively connected to an output of the SC-DCO for generating a frequency-divided radio frequency signal, the SoC being configured to use the frequency-divided radio frequency signal as a digital system clock of the SoC.

\* \* \* \* \*